(12) United States Patent
Stainer

(10) Patent No.: US 9,875,781 B2
(45) Date of Patent: Jan. 23, 2018

(54) METHOD FOR WRITING TO A MRAM DEVICE CONFIGURED FOR SELF-REFERENCED READ OPERATION WITH IMPROVED REPRODUCIBLY

(71) Applicant: CROCUS Technology SA, Grenoble (FR)

(72) Inventor: Quentin Stainer, Montbonnot-St-Martin (FR)

(73) Assignee: CROCUS TECHNOLOGY SA, Grenoble (FR)

( * ) Notice: Subject to any disclaimer, the term of this patent is extended or adjusted under 35 U.S.C. 154(b) by 0 days.

(21) Appl. No.: 15/116,959

(22) PCT Filed: Feb. 3, 2015

(86) PCT No.: PCT/EP2015/052161
§ 371 (c)(1),
(2) Date: Aug. 5, 2016

(87) PCT Pub. No.: WO2015/117941
PCT Pub. Date: Aug. 13, 2015

(65) Prior Publication Data
US 2017/0169871 A1 Jun. 15, 2017

(30) Foreign Application Priority Data
Feb. 6, 2014 (EP) .................... 14290031

(51) Int. Cl.
*G11C 15/02* (2006.01)
*G11C 11/16* (2006.01)
(Continued)

(52) U.S. Cl.
CPC ...... *G11C 11/1675* (2013.01); *G11C 11/5628* (2013.01); *G11C 15/02* (2013.01); *H01F 10/3272* (2013.01); *H01L 27/222* (2013.01)

(58) Field of Classification Search
CPC ... G11C 11/161; G11C 11/1675; G11C 11/16; G11C 11/5607; G11C 11/1673; G11C 19/0825; G11C 5/063
(Continued)

(56) References Cited

U.S. PATENT DOCUMENTS 7,903,452 B2    3/2011  Dittrich et al.
2010/0080049 A1  4/2010  Lheng et al.
(Continued)

FOREIGN PATENT DOCUMENTS

EP    2575135 A1    4/2013

OTHER PUBLICATIONS

International Search Report for PCT/EP2015/052161 dated Apr. 24, 2015.
Written Opinion for PCT/EP2015/052161 dated Apr. 24, 2015.

*Primary Examiner* — Thong Q Le
(74) *Attorney, Agent, or Firm* — Pearne & Gordon LLP

(57) ABSTRACT

A method for writing a MRAM device, including magnetic tunnel junction with a storage layer, a sense layer, and a spacer layer between the storage and sense layers. At least one of the storage and sense layers has a magnetic anisotropy axis. The method includes an initialization step including: applying an initial heating current pulse for heating the magnetic tunnel junction to a temperature above a threshold temperature at which a storage magnetization is freely orientable, providing an initial resultant magnetic field for adjusting the storage magnetization in an initial direction oriented along the magnetic anisotropy axis. The method allows performing the writing step with improved reproducibly.

6 Claims, 6 Drawing Sheets

(51) Int. Cl.
  *G11C 11/56*    (2006.01)
  *H01L 27/22*    (2006.01)
  *H01F 10/32*    (2006.01)

(58) Field of Classification Search
  USPC ....... 365/158, 171, 173, 175, 200, 209, 211, 365/227
  See application file for complete search history.

(56) References Cited

U.S. PATENT DOCUMENTS

2012/0314487 A1* 12/2012 El Baraji .............. G11C 11/161
 365/158
2013/0094283 A1   4/2013 Berger et al.
2013/0201756 A1*  8/2013 Lombard ................ G11C 11/16
 365/158

* cited by examiner

METHOD FOR WRITING TO A MRAM DEVICE CONFIGURED FOR SELF-REFERENCED READ OPERATION WITH IMPROVED REPRODUCIBLY

FIELD

The present invention concerns a method for writing to a multibit magnetic random access memory (MRAM) device with improved reproducibly.

DESCRIPTION OF RELATED ART

Self-referenced MRAM cells include a sense layer, a storage layer, and a spacer layer disposed between the sense layer and the storage layer. During a multi-level write operation, the storage layer has a magnetization direction that is switchable between m directions to store data corresponding to one of m logic states, with m being greater than 2. During a read operation, the sense layer has a magnetization direction that is varied, relative to the magnetization direction of the storage layer, to determine the data stored by the storage layer.

However, due to the magnetocrystalline anisotropy of the storage layer and of the sense layer, the initial configurations of the sense and storage magnetizations lead to different switched orientations of the storage magnetization. Orienting the storage magnetization in the same direction irrespective of its initial orientation would require applying very strong write magnetic fields. The write operation thus depends on the initial orientation of the storage magnetization and is not reproducible.

US2010080049 discloses methods of writing to a multibit MRAM memory unit including to self-detected writing to a multi-bit thermally assisted MRAM. The self-detected writing increases a reading margin between data state levels and decreases reading margin variability due to cell resistance variation.

U.S. Pat. No. 7,903,452 describes a magnetoresistive memory cell having a magnetic stack providing an effective anisotropy field of a storage layer of the magnetic stack during thermal select heating, at least one line providing at least one external magnetic field to the magnetic stack, the effective anisotropy field and the at least one external magnetic field having a non-zero angle relative to one another.

US2013094283 describes a memory device includes a plurality of MRAM cells, a field line, and a field line controller configured to generate a write sequence that traverses the field line. The write sequence is for writing a multi-bit word to the plurality of MRAM cells. The multi-bit word includes a first subset of bits having a first polarity and a second subset of bits having a second polarity. The write sequence writes concurrently to at least a subset of the plurality of MRAM cells corresponding to the first subset of bits having the first polarity, then subsequently writes concurrently to a remaining subset of the plurality of MRAM cells corresponding to the second subset of bits having the second polarity.

EP2575135 concerns a MRAM cell comprising a synthetic storage layer and a sense layer having a sense magnetization that is reversible, wherein a net local magnetic stray field couples the storage layer with the sense layer, and wherein the net local magnetic stray field being such that the net local magnetic stray field coupling the sense layer is below 50 Oe.

SUMMARY

The present disclosure concerns a method for writing to a MRAM device, comprising:

providing a MRAM cell comprising a magnetic tunnel junction with a storage layer having storage magnetization that is pinned below a threshold temperature and freely orientable at a temperature at or above the threshold temperature; a sense layer having a sense magnetization that is freely orientable; and a spacer layer between the sense layer and the storage layer; at least one of the storage layer and the sense layer having a magnetic anisotropy axis wherein the magnetic anisotropy axis (200) is an intrinsic anisotropy;

during a writing step to one of m logic states, wherein the storage layer is switchable between m different directions corresponding to m logic states, with m being greater than 2:
   applying a heating current pulse adapted for heating the magnetic tunnel junction to a temperature at or above the threshold temperature; and
   inducing a write magnetic field having a predetermined amplitude and a predetermined orientation with respect to the magnetic anisotropy axis for aligning the storage magnetization in a written direction;
performing an initialization step in response to a writing command to perform a writing step, the initialization step comprising:
   applying an initial heating current pulse adapted for heating the magnetic tunnel junction to a temperature at or above the threshold temperature; and
   providing an initial resultant magnetic field for adjusting the storage magnetization along the magnetic anisotropy axis;
   the initialization step being performed prior to the writing step The write operation comprising the writing step and the initialization step allows performing the writing step reproducibly using a resultant magnetic field having low amplitude. The encoded logic state is independent of the initial configuration of the storage magnetization.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS

Figures 1, 2:
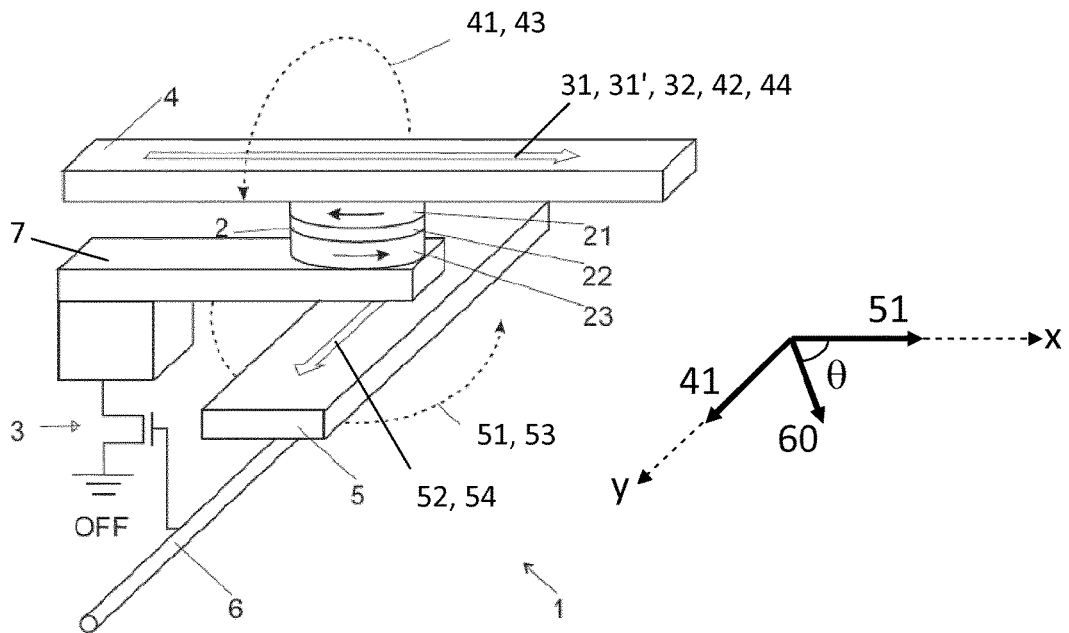
FIG. 1 shows a view of a MRAM cell including a magnetic tunnel junction comprising a sense layer having a sense magnetization and a storage layer having a storage magnetization, according to an embodiment.
FIG. 2 illustrates a second magnetic field and a first magnetic field projected along an x-y plane in which the storage magnetization direction is switchable.

FIG. 1 shows a view of a MRAM cell 1 including a magnetic tunnel junction 2 comprising a sense layer 21, a storage layer 23 and a spacer layer 22 that is disposed between the sense layer 21 and the storage layer 23. A bit line 4 is electrically coupled to the magnetic tunnel junction 2 on the side of the sense layer 21 and is substantially orthogonal to a field line 5, which is disposed below and magnetically coupled to the magnetic tunnel junction 2 on the side of the storage layer 23. The MRAM cell 1 also includes a selection transistor 3, which is electrically coupled, through a strap 7, to the magnetic tunnel junction 2 on the side of the storage layer 23. Other implementations of the MRAM cell 1 are contemplated. For example, the relative positioning of the sense layer 21 and the storage layer 23 can be reversed in the magnetic tunnel junction 2, with the storage layer 23 disposed above the sense layer 21.

Each of the sense layer 21 and the storage layer 23 comprises, or is formed of, a magnetic material and, in particular, a magnetic material of the ferromagnetic type. In general, the sense layer 21 and the storage layer 23 can include the same ferromagnetic material of different ferromagnetic materials. The sense layer 21 can comprise a soft ferromagnetic material, namely one having a relatively low coercivity, such as no greater than about 0.01 Oe and the storage layer 23 can comprise a hard ferromagnetic material, namely one having a relatively high coercivity, such as greater than about 0.01 Oe. In such manner, a sense magnetization 210 of the sense layer 21 can be readily varied under low-intensity magnetic fields during read operations and a storage magnetization 230 of the storage layer 23 remains stable. Other implementations of the sense layer 21 and the storage layer 23 are contemplated. For example, either, or both, of the sense layer 21 and the storage layer 23 can include multiple sub-layers in a fashion similar to that of the so-called synthetic antiferromagnetic layer.

The spacer layer 22 functions as a tunnel barrier and comprises, or is formed of, an insulating material. Suitable insulating materials include oxides, such as aluminium oxide (e.g., $Al_2O_3$) and magnesium oxide (e.g., MgO). A thickness of the spacer layer 22 can be in the nm range, such as from about 1 nm to about 10 nm.

Figure 3:
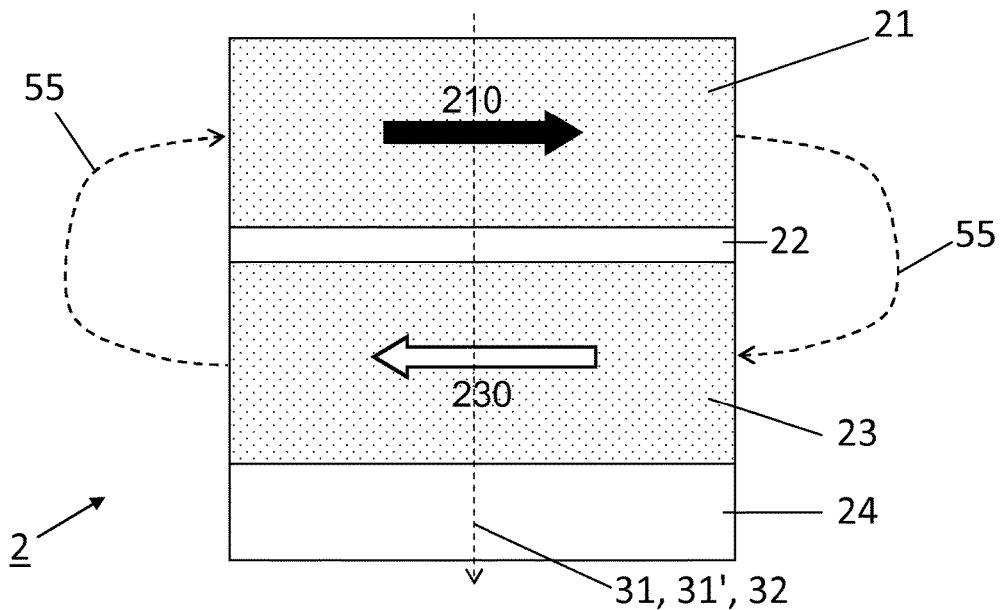
FIG. 3 represents the magnetic tunnel junction further including an antiferromagnetic layer, according to an embodiment.

Referring to FIG. 3, the magnetic tunnel junction 2 also includes an antiferromagnetic layer 24, which is disposed adjacent to the storage layer 23 and, through exchange bias, stabilizes the storage magnetization 230 along a particular direction when a temperature within, or in the vicinity of, the antiferromagnetic layer 24 is lower than a threshold temperature $T_B$, such as a blocking temperature, a Neel temperature, or another threshold temperature. When the temperature is at or above the threshold temperature $T_B$, the antiferromagnetic layer 24 unpins, or decouples, the storage magnetization 230, thereby allowing the storage magnetization 230 to be switched. In contrast, such an antiferromagnetic layer is omitted adjacent to the sense layer 21, and, as a result, the sense magnetization 210 that is unpinned and is readily varied, with the substantial absence of exchange bias. The antiferromagnetic layer 24 can include, or be formed of, a suitable antiferromagnetic magnetic material including transition metals and their alloys, such as alloys based on manganese ("Mn"), alloys based on iridium ("Ir") and Mn (e.g., IrMn); alloys based on Fe and Mn (e.g., FeMn); alloys based on platinum ("Pt") and Mn (e.g., PtMn); and alloys based on Ni and Mn (e.g., NiMn).

A TAS-type write operation of the MRAM cell 1, comprises a writing step, comprising:

passing a heating current pulse 31 adapted for heating the magnetic tunnel junction 2 to a temperature at or above the threshold temperature $T_B$; and inducing a set of write magnetic fields 41, 51 having a predetermined amplitude and a predetermined orientation with respect to the magnetic anisotropy axis 200, for aligning the storage magnetization 230 in a written direction.

The heating current pulse 31 is passed through the magnetic tunnel junction 2 via the bit line 4, with the selection transistor 3 in a saturated mode. Heating the magnetic tunnel junction 2 to a temperature at or above the threshold temperature $T_B$ of the antiferromagnetic layer 24, such that the storage magnetization 230 is unpinned. Simultaneously or after a short time delay, at least one of the field line 5 and the bit line 4 (functioning as another field line) is activated to induce the set of write magnetic fields 41, 51 such as to switch the storage magnetization 230 from an initial direction to the written direction (see FIG. 1). Specifically, a first write current 52 can be applied through the field line 5 to induce a first write magnetic field 51 to switch the storage magnetization direction 230 accordingly. Alternatively, or in combination, a second write current 42 can be applied through the bit line 4 to induce a second write magnetic field 41 to switch the storage magnetization direction 230 accordingly.

FIG. 2 illustrates the second magnetic field 41 induced by the bit line 4 and the first magnetic field 51 induced by the field line 5 projected along a plane (here, an x-y plane) in which the storage magnetization direction 230 is switchable. Specifically, the second magnetic field 41 corresponds to a y-component, when projected along the plane, and the first magnetic field 51 corresponds to an x-component, when projected along the plane, of a resultant magnetic field 60. The resultant magnetic field 60 is oriented at an angle θ relative to the positive x-axis. By varying the signs and magnitudes of the first and second magnetic fields 51 and 41, namely by varying the directions and magnitudes of the second write current 42 passing through the bit line 4 and the first write current 52 passing through the field line 5, distinct orientations of the resultant magnetic field 60, i.e., distinct values of θ are obtained in the range of 0° to 360°.

In accordance with a multi-bit implementation of the MRAM cell 1, the storage magnetization direction 230 is switchable between m directions in accordance with m distinct values of θ of the resultant magnetic field 60 (where m>2). Consequently, m logic states can be encoded, with each logic state assigned to a distinct value of θ.

Once the storage magnetization direction 230 is switched to a written direction, the selection transistor 3 is switched to a blocked mode to inhibit heating current 31 flowing through the magnetic tunnel junction 2, thereby cooling the magnetic tunnel junction 2. Either, or both, of the first and second write magnetic fields 51 and 41 can be maintained during cooling of the magnetic tunnel junction 2, and can be deactivated once the magnetic tunnel junction 2 has cooled below the threshold temperature of the antiferromagnetic layer 24. Because the storage magnetization direction 230 is pinned by the exchange bias of the antiferromagnetic layer 24, its orientation remains stable so as to retain the written data.

Figure 11:
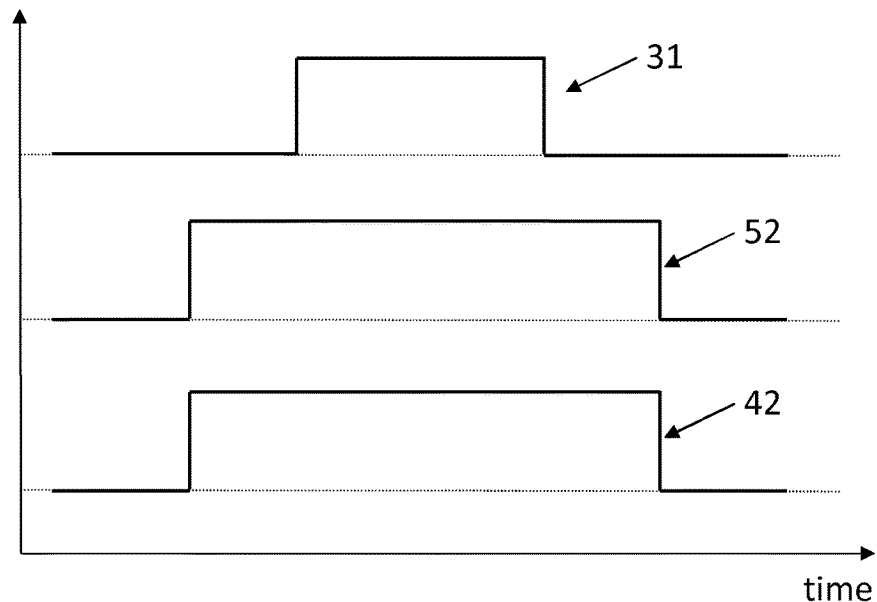
FIG. 11 show sequences of heating current pulse and write currents during the write operation, according to an embodiment.

FIG. 11 show sequences of the heating current pulse 31 and of the first second write currents 52, 42 adapted for inducing the resultant magnetic field 60. In FIG. 11, the first second write currents 52, 42 are applied prior the onset of the heating current 31 and turned off after the heating current 31 has been turned off.

During a read operation of the MRAM cell 1, at least one of the field line 5 and the bit line 4 (functioning as another field line) is activated to induce a set of read magnetic fields 53, 43 to vary the magnetization 210. Specifically, a first read current 54 can be applied through the field line 5 to induce a first read magnetic field 53 to vary the sense magnetization direction 210 accordingly. Alternatively, or in combination, a second read current 44 can be applied through the bit line 4 to induce a second read magnetic field 43 to vary the sense magnetization direction 210 accordingly. Because the sense layer 21 is subject to little or no exchange bias, the sense magnetization direction can be readily varied under low-intensity magnetic fields and at a temperature below the threshold temperature, while the storage magnetization direction 230 remains stable in a written direction.

Figure 4:
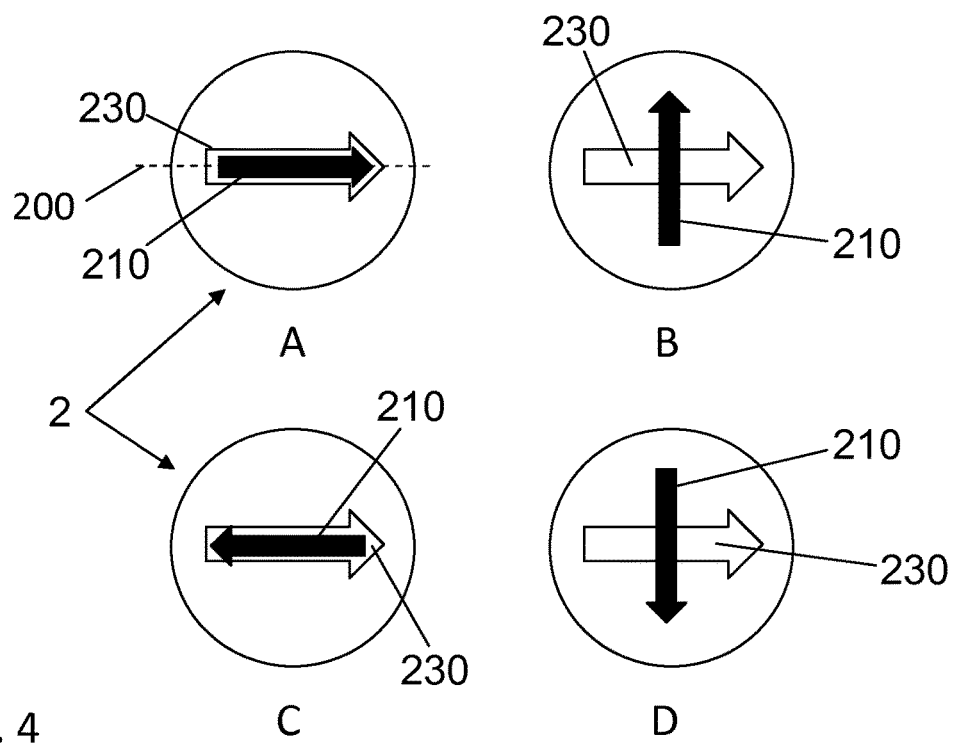
FIG. 4 shows a top view of the magnetic tunnel junction representing the storage magnetization oriented parallel (A), antiparallel (C) and orthogonal (B and D) to the sense magnetization, according to an embodiment.

For certain implementations, the read operation of the MRAM cell 1 is carried out in multiple read cycles, in which the field line 5 and the bit line 4 (functioning as another field line) are activated to induce a set of resultant read magnetic fields (similarly to the resultant magnetic field 60) compatible with a write encoding scheme. Because the sense magnetization direction 210 can be aligned according to the resultant read magnetic fields, the sense magnetization direction can be successively switched between m directions according to the write encoding scheme. Thus, during a read operation, the sense magnetization direction 210 is varied, relative to the storage magnetization direction 230, to determine the data stored by the storage layer. FIG. 4 schematically shows a top view of the magnetic tunnel junction 2 where the orientation of the storage magnetization 230 and the sense magnetization 210 are represented. In the example of FIG. 4, the storage magnetization 230 is oriented towards the right. A first read cycle can generate a resultant read magnetic field at an angle θ=0°, orienting the sense magnetization 210 parallel to the storage magnetization 230 (A); a second read cycle can generate a resultant read magnetic field at an angle θ=90°, orienting the sense magnetization 210 at 90° with respect to the storage magnetization 230 (B); a third read cycle can generate a resultant read magnetic field at an angle θ=180°, orienting the sense magnetization 210 antiparallel to the storage magnetization 230 (C); and a fourth read cycle can generate a resultant read magnetic field at an angle θ=270°, orienting the sense magnetization 210 at 270° with respect to the storage magnetization 230 (D). In such manner, the sense magnetization direction 210 is rotated to m distinct values of θ according to the write encoding scheme.

Figure 5:
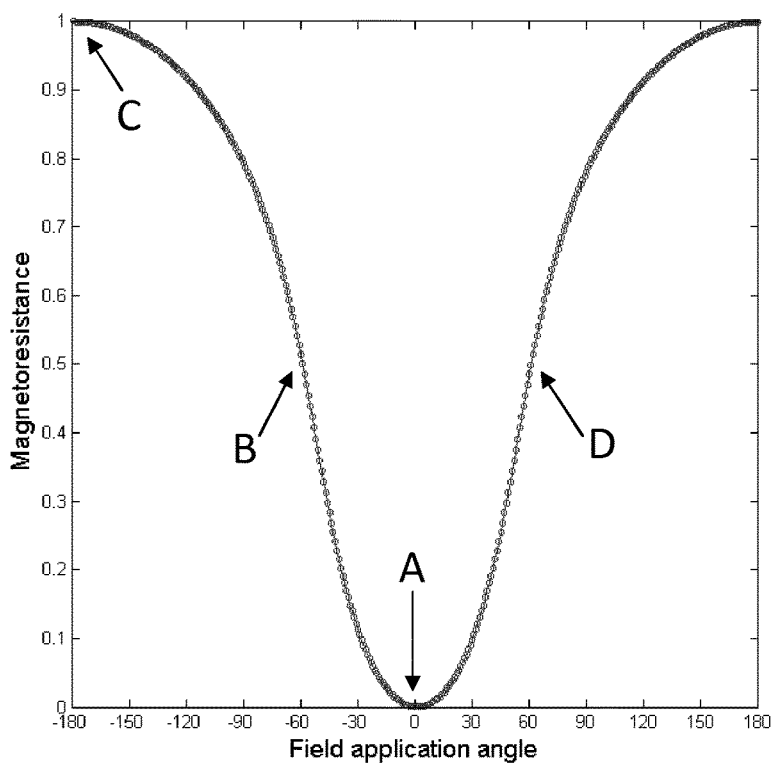
FIG. 5 illustrates a magnetoresistance or the magnetic tunnel junction as a function of the orientation of a read magnetic field, according to an embodiment.

As part of each read cycle, a degree of alignment between the sense magnetization direction 210 and the storage magnetization direction 230 is determined by passing a sense current 32 though the magnetic tunnel junction 2 via the bit line 4, with the selection transistor 3 in a saturated mode. Measuring a resulting voltage across the magnetic tunnel junction 2 when the sense current 32 is applied yields a resistance value of the magnetic tunnel junction 2 for a particular read cycle and for a particular value of θ. Alternatively, a resistance value can be determined by applying a voltage across the magnetic tunnel junction 2 and measuring a resulting current. FIG. 5 illustrates a magnetoresistance or the magnetic tunnel junction 2 as a function of the orientation of the read magnetic field. When the respective sense magnetization 210 and the storage magnetization 230 are antiparallel (FIGS. 4 and 5, C), a resistance value of the magnetic tunnel junction 2 typically corresponds to a maximum value, namely $R_{max}$, and, when the respective magnetizations are parallel (FIGS. 4 and 5, A), a resistance value of the magnetic tunnel junction 2 typically corresponds to a minimum value, namely $R_{min}$. When the respective magnetizations are between antiparallel and parallel (FIGS. 4 and 5, B and D), a resistance value of the magnetic tunnel junction 2 is typically between $R_{max}$ and $R_{min}$. Resistance values for multiple read cycles are processed to determine which value of θ yielded a minimum resistance value, thereby yielding a stored multi-bit data value based on which of m logic states is assigned to that value of θ. Processing of the resistance values can be carried out using a suitable controller in combination with, for example, a sample/hold circuit.

Figure 6:
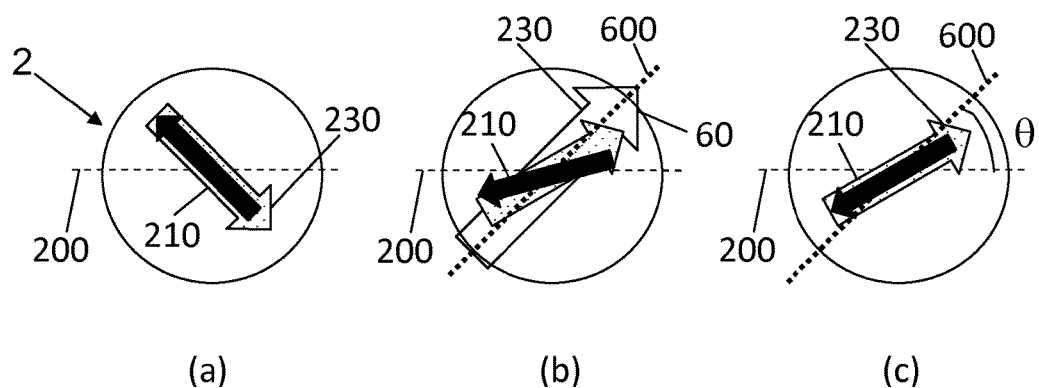
FIGS. 6 and 7 illustrate different initial configurations of the sense and storage magnetizations with respect to a magnetic anisotropy axis of the sense layer and/or storage layer, according to an embodiment.
Figure 7:
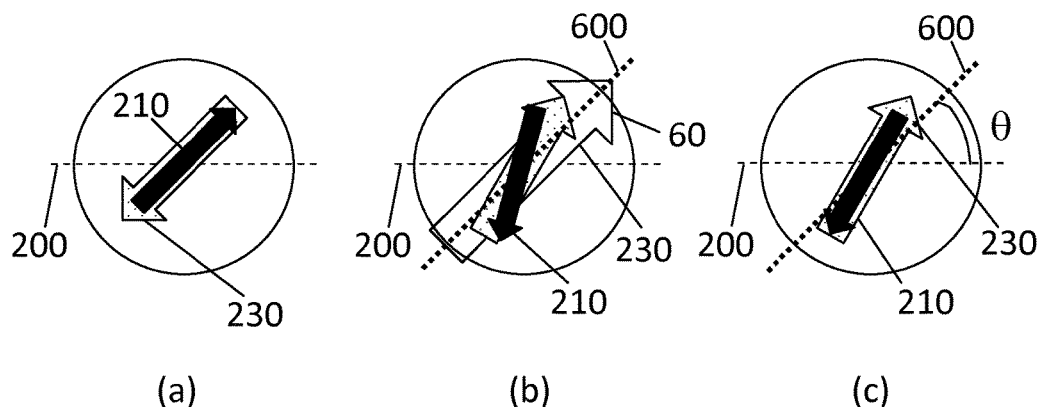

Referring to FIGS. 6 and 7, a top view of the magnetic tunnel junction 2 illustrates the orientation of the storage magnetization 230 and the sense magnetization 210. At least one of the storage layer 23 and the sense layer 21 has a magnetic anisotropy axis 200 (or easy axis). The magnetic anisotropy axis 200 can correspond to a longest dimension axis (or a major axis) of the magnetic tunnel junction 2 and imparting a pair of energetically favorable directions along the magnetic anisotropy axis 200. In the examples of FIGS. 6 and 7, the cross-section of the magnetic tunnel junction 2 is substantially circular and the magnetic anisotropy axis originates from intrinsic anisotropy and imparts a pair of energetically favorable directions along the easy axis. Intrinsic anisotropy of the magnetic tunnel junction 2 can be achieved through intrinsic material characteristics, such as magnetocrystalline anisotropy in which an atomic structure or orientation of a crystal imparts a directional dependence for magnetization; anisotropy introduced during manufacturing, such as annealing in the presence of a magnetic field; or a combination of material characteristics and manufacturing conditions.

More particularly, FIGS. 6a and 7a illustrate different initial configurations wherein the sense and storage magnetizations 210, 230 are oriented at a certain angle with respect to the magnetic anisotropy axis 200. During the write operation, the magnetic tunnel junction 2 is heated to a temperature at or above the threshold temperature $T_B$ by applying the heating current 31 through the magnetic tunnel junction 2. The first write magnetic field 51 and/or the second write magnetic field 41 are induced such as to provide the resultant magnetic field 60 as described above. In FIG. 6b, the resultant magnetic field 60 is represented oriented along an axis 600 at an angle θ relative to the magnetic anisotropy axis 200 such as to switch the storage magnetization 230 in accordance with the direction of the resultant magnetic field 60 and to encode a given logic state. In the example of FIGS. 6 and 7, the magnetic anisotropy axis 200 is oriented along the bit line 4 (see FIG. 1) and the resultant magnetic field 60 can be provided by inducing only the first write magnetic field 51 and the second write magnetic field 41. The heating current 31 is then inhibited, thereby cooling the magnetic tunnel junction 2 to a temperature below the high threshold temperature $T_B$ such as to pin the storage magnetization 230 in its written direction (see FIGS. 6*c* and 7*c*).

However, due to the magnetocrystalline anisotropy 200 of the storage layer 23 and of the sense layer 21, the initial configurations of the sense and storage magnetizations 210, 230 (see FIGS. 6*a* and 7*a*) lead to different switched orientations of the storage magnetization 230 (see FIGS. 6*c* and 7*c*). Orienting the sense and storage magnetizations 210, 230 in the same direction irrespective of their initial orientations would require applying very strong, for example of the order of 1 kOe, first and/or second write magnetic fields 51, 41. The write operation thus depends on the initial orientations of the sense and storage magnetizations 210, 230 and is not reproducible.

Figure 8:
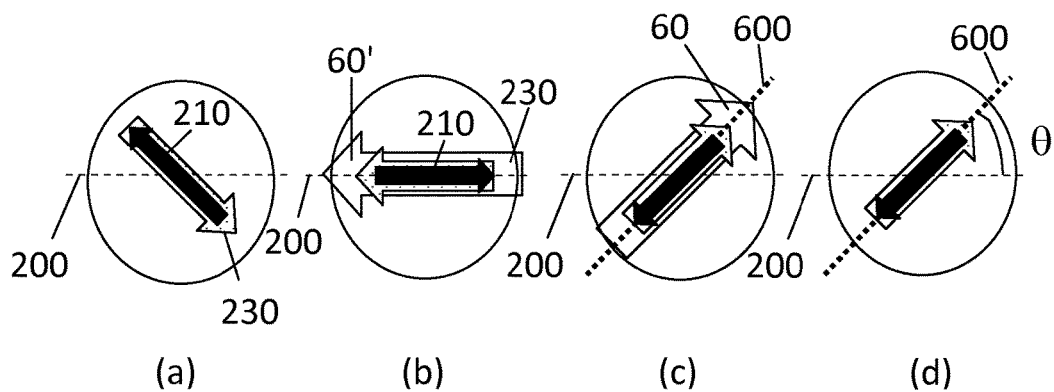
FIGS. 8 and 9 illustrate a write operation for writing to the MRAM device, according to an embodiment.
Figure 9:
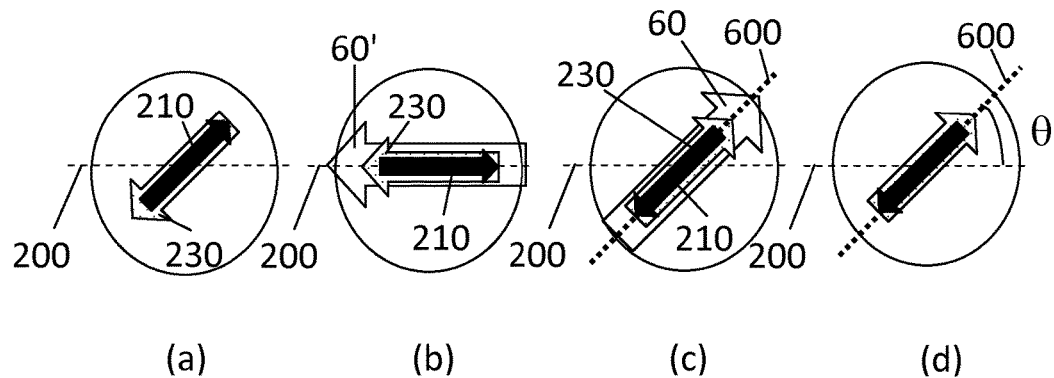

In an embodiment illustrated in FIGS. 8 and 9, the write operation of the MRAM cell 1 comprises an initialization step performed prior to the writing step. The initialization step comprises:

applying an initial heating current pulse 31′ adapted for heating the magnetic tunnel junction 2 to a temperature at or above the threshold temperature $T_B$; and providing an initial resultant magnetic field 60′ with an amplitude and orientation adapted for adjusting the storage magnetization 230 in an initial direction being along the magnetic anisotropy axis 200.

The initial heating current pulse 31′ is then inhibited such as to cool the magnetic tunnel junction 2 to a temperature below the high threshold temperature $T_B$ such as to pin the storage magnetization in the initial direction.

The method can further comprise a step of inhibiting the initial resultant magnetic field 60′ for relaxing the storage magnetization direction 230 such that the initial direction of the storage magnetization 230 is oriented along the magnetic anisotropy axis 200. The relaxation step allows the initial direction of the storage magnetization 230 to be oriented along the magnetic anisotropy axis 200, even if there is a misalignment between the initial resultant magnetic field 60′ and the magnetic anisotropy axis 200. The relaxation step thus avoids having the initial direction of the storage magnetization 230 being pinned (after cooling the magnetic tunnel junction 2) in a non-minimal state.

FIGS. 8*a* and 9*a* illustrate initial configurations where the sense and storage magnetizations 210, 230 are oriented at a certain angle with respect to the magnetic anisotropy axis 200. FIGS. 8*b* and 9*b* represent the initialization step where the initial heating current pulse 31′ is passed in the magnetic tunnel junction 2 such as to heat the magnetic tunnel junction 2 above the threshold temperature $T_B$ and free the storage magnetization 230, and where the set of write magnetic fields 41, 51 is induced such as to provide the initial resultant magnetic field 60′ oriented along the magnetic anisotropy axis 200. In the example of FIGS. 8*b* and 9*b*, the magnetic anisotropy axis 200 is oriented along the bit line 4 (see FIG. 1) and the initial resultant magnetic field 60′ can be provided by inducing only the first write magnetic field 51. After inhibiting the initial resultant magnetic field 60′, by inhibiting the first write magnetic field 51 and/or the second write magnetic field 41, the storage magnetization 230 is oriented along the magnetic anisotropy axis 200.

The amplitude and orientation of the initial resultant magnetic field 60′ can be adjusted such that the storage magnetization 230 is switched directly by the initial resultant magnetic field 60′. The initial resultant magnetic field 60′ can be between 40 Oe and 120 Oe but preferably about 80 Oe.

Figure 12:
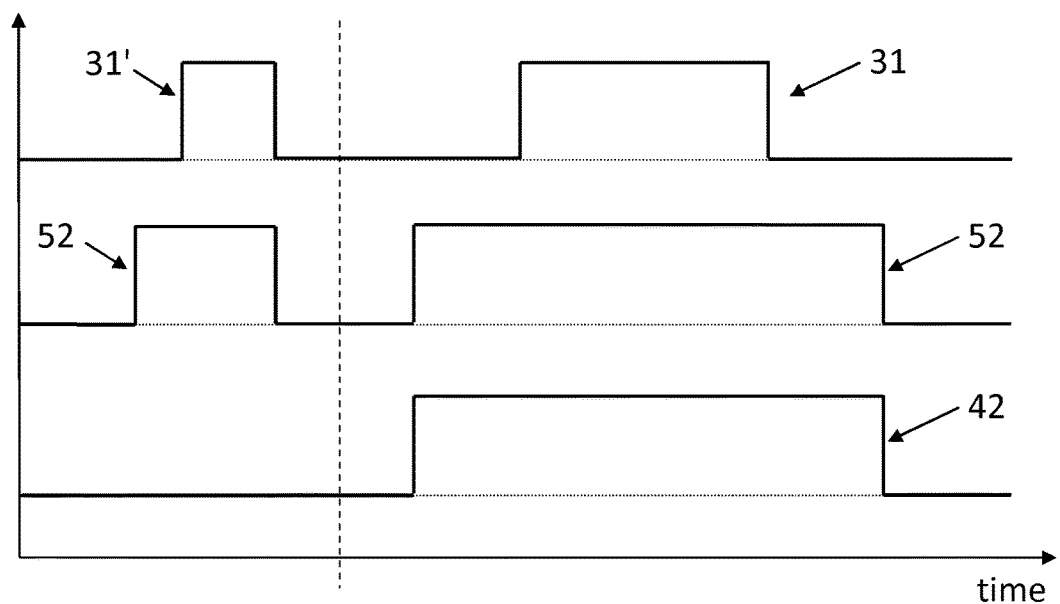
FIG. 12 show sequences of initial heating current pulse and of write currents during the initialization step and sequences of heating current pulse and write currents during the write operation, according to an embodiment.

FIG. 12 show sequences of the initial heating current pulse 31′ and of the first write current 52 adapted for inducing the initial resultant magnetic field 60′ during the initialization step; followed by sequences of the heating current pulse 31 and of the first second write currents 52, 42 adapted for inducing the resultant magnetic field 60 during the writing step. In FIG. 12, the first write current 52 is applied prior the onset of the initial heating current 31′ and turned off simultaneously with the initial heating current 31′. In FIG. 12, a dashed line schematically represent the passage from the initialization step to the writing step.

In a variant of the initialization step represented in FIG. 3, the amplitude and orientation of the initial resultant magnetic field 60′ is adjusted such as to saturate the sense magnetization 210 in a direction oriented along the magnetic anisotropy axis 200. The saturated sense magnetization 210 induces in turn a local magnetic stray field 55 magnetically coupling the storage layer 23 in a closed magnetic flux configuration. The storage magnetization 230 is then switched in accordance with the local magnetic field 55, and thus along the magnetic anisotropy axis 200.

Due to the small distance between the storage layer 23 and the sense layer 21, typically in the nanometer range, the amplitude of the resultant magnetic field 60′ required for generating the magnetic stray field 55 can be smaller than the initial resultant magnetic field 60′ required for directly orienting the storage magnetization 230. Moreover, the material of the sense layer 21 can be selected as to minimize the amplitude of the initial resultant magnetic field 60′ required for saturating the sense magnetization 210. For instance, the amplitude of the initial resultant magnetic field 60′ can be between 100 Oe and 200 Oe, for example, about 150 Oe.

In the case (not shown) where the sense layer 21 includes a synthetic antiferromagnetic layer comprising multiple sub-layers, the magnitude of the magnetic stray field 55 is a combination of the magnetic stray fields generated by the sense magnetization of each of the sub-layers.

The writing step of the write operation can then be performed, as described above, by applying the heating current 31 through the magnetic tunnel junction 2 for heating the magnetic tunnel junction 2 to a temperature above the threshold temperature $T_B$. Simultaneously or after a short time delay, inducing the first write magnetic field 51 and/or the second write magnetic field 41 for providing the resultant magnetic field 60 such as to switch the storage magnetization 230 in accordance with the direction of the resultant magnetic field 60. In the example of FIGS. 8*c* and 9*c*, the respective magnitudes of the first and second write magnetic field 51, 41 are such that the resultant magnetic field 60 is oriented with an angle θ with respect to the magnetic anisotropy axis 200 such as to orient the storage magnetization 230 in the same direction and to encode a given logic state. The heating current 31 is then inhibited, thereby cooling the magnetic tunnel junction 2 to a temperature below the high threshold temperature $T_B$ such as to pin the storage magnetization 230 in its written direction (see FIGS. 8*d* and 9*d*).

In contrast with the example illustrated in FIGS. 6 and 7, the written orientation of the storage magnetization 230 in FIG. 8*d* is the same as the one in FIG. 9*d*. This is the case despite the initial orientation of the storage magnetization 203 was different to the initial orientation the storage magnetization 230 in FIG. 9*d*. Indeed, the initial step of adjusting the storage magnetization 230 along the magnetic anisotropy axis 200 allows for an initial writing orientation of the storage magnetization 230 such that the storage magnetization 230 can be reproducibly oriented at a predetermined orientation during the writing operation, independent of the initial orientation of the storage magnetization 230. The storage magnetization 230 can thus be reproducibly written in a given orientation using a magnitude of the first write magnetic field 51 and/or the second write magnetic field 41 that is much smaller than the one that would be required for reproducibly writing the storage magnetization 230 without the initialization step.

Figure 10:
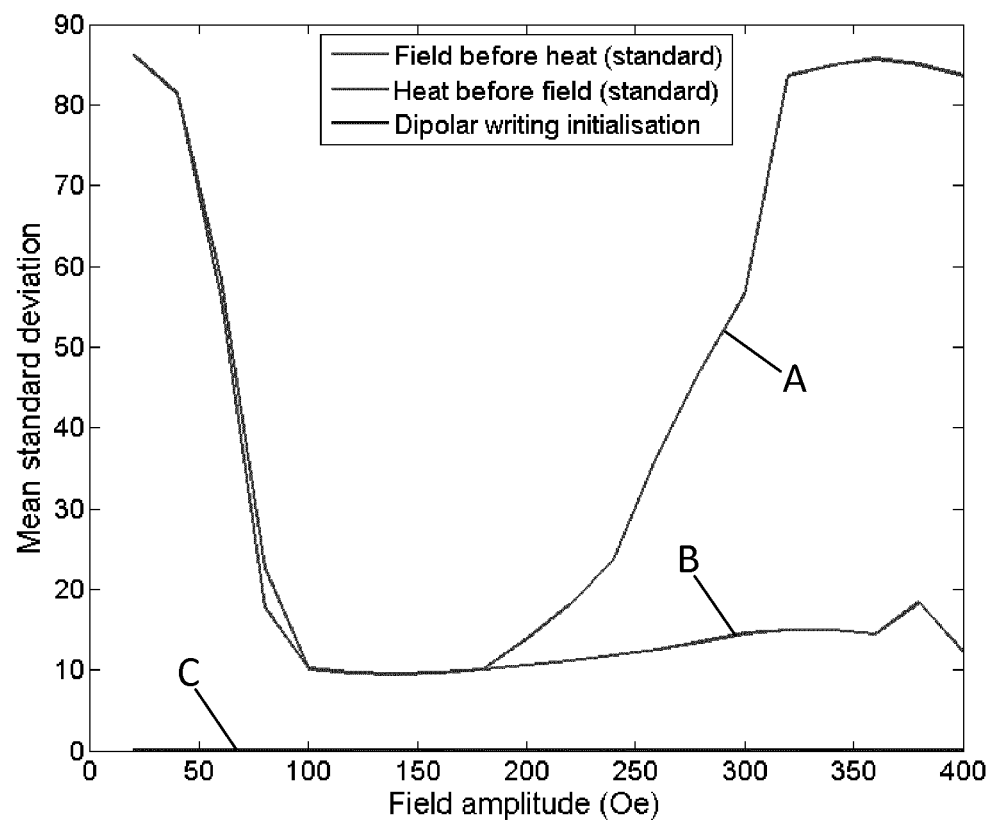
FIG. 10 compares the mean standard variation of the storage magnetization direction after a write operation as a function of the amplitude of a resultant magnetic field used during the writing step for three variants of the write operation.

FIG. 10 compares the mean standard variation of the storage magnetization direction 230 after a write operation as a function of the amplitude of the resultant magnetic field 60 used during the writing step for three variants of the write operation. The mean standard variation has been obtained by performing four write operations on a MRAM cell 1 having four different initial configurations of the sense and storage magnetizations 210, 230. In particular, curve B corresponds to the write operation comprising the writing step without the initialization step, where the set of write magnetic fields 41, 51 is activated after passing the heating current pulse 31. Curve B shows that reproducibility of the writing step improves when the amplitude of the resultant magnetic field 60 is around 100 Oe and above. Curve A corresponds to the write operation comprising the writing step without the initialization step, where the set of write magnetic fields 41, 51 is activated prior to passing the heating current pulse 31. Here, reproducibility of the writing step is optimal in a limited range of amplitudes of the resultant magnetic field 60 between about 100 Oe and 200 Oe. Curve C corresponds to the write operation comprising the writing step and the initialization step, where the storage magnetization 230 is aligned along the magnetic anisotropy axis 200 in accordance with the local magnetic field 55. Here, the writing step is reliable over the whole range of the resultant magnetic field 60 (between about 20 Oe and 400 Oe).

Using the write operation comprising the writing step and the initialization step allows performing the writing step reproducibly. The written orientation of the storage magnetization 230, and thus the encoded logic state, becomes independent of its initial configuration. Moreover, due to the low amplitude of the resultant magnetic field 60 required for reproducibly performing the write operation, the power consumption of operation of the MRAM cell 1 is significantly reduced.

REFERENCE NUMBERS

1 MRAM cell
2 magnetic tunnel junction
200 magnetic anisotropy axis
21 storage layer
210 sense magnetization
22 spacer layer
23 storage layer
230 storage magnetization
24 antiferromagnetic layer
3 selection transistor
31 heating current
31' initial heating current
32 sense current
4 bit line
41 second write magnetic field
42 second write current
43 second read magnetic field
44 second read current
5 field line
51 first write magnetic field
52 first write current
53 first read magnetic field
54 first read current
55 local magnetic stray field
60 resultant magnetic field
60' initial resultant magnetic field
600 magnetic field axis
7 strap
θ angle
$R_{max}$ maximum value of resistance
$R_{min}$ minimum value of resistance
$T_B$ high threshold temperature

What is claimed is:

1. A method for writing a memory device, comprising:
providing a magnetic random access memory, hereinafter termed MRAM, cell comprising a magnetic tunnel junction with a storage layer having storage magnetization that is pinned below a threshold temperature and freely orientable at a temperature above the threshold temperature; a sense layer having a sense magnetization that is freely orientable; and a spacer layer between the sense layer and the storage layer; at least one of the storage layer and the sense layer having a magnetic anisotropy axis wherein the magnetic anisotropy axis is an intrinsic anisotropy;
during a writing step to one of m logic states, wherein the storage layer is switchable between m different directions corresponding to said m logic states, with m being greater than 2:
applying a heating current pulse adapted for heating the magnetic tunnel junction to a temperature above the threshold temperature; and
inducing a write magnetic field having a predetermined amplitude and a predetermined orientation with respect to the magnetic anisotropy axis for aligning the storage magnetization in a written direction; and
the method further comprises, performing an initialization step in response to a writing command to perform said writing step,
wherein the initialization step comprises:
applying an initial heating current pulse adapted for heating the magnetic tunnel junction to a temperature above the threshold temperature; and
providing an initial resultant magnetic field for adjusting the storage magnetization in an initial direction along the magnetic anisotropy axis;
wherein the initialization step being performed prior to the writing step.

2. Method according to claim 1, further comprising a step of inhibiting the initial resultant write magnetic field such as to relax the storage magnetization direction such that the initial direction is in a direction along the magnetic anisotropy axis.

3. Method according to claim 1,
wherein the MRAM cell further comprises a bit line electrically coupled to the magnetic tunnel junction and orthogonal to a field line; and
wherein providing an initial resultant magnetic field comprises inducing a set of write magnetic fields by activating at least one of the field line and the bit line.

4. Method according to claim 1, wherein the amplitude and orientation of the initial resultant magnetic field is adjusted such that the storage magnetization is switched directly by the initial resultant magnetic field.

5. Method according to claim 1, wherein the amplitude and orientation of the initial resultant magnetic field is adjusted such as to saturate the sense magnetization in a direction oriented along the magnetic anisotropy axis such as to induces a magnetic stray field adapted for switching the storage magnetization along the magnetic anisotropy axis.

6. A method for writing a memory device, comprising:
   providing a magnetic random access memory, hereinafter termed MRAM, cell comprising a magnetic tunnel junction with a storage layer having storage magnetization that is pinned below a threshold temperature and freely orientable at a temperature above the threshold temperature; a sense layer having a sense magnetization that is freely orientable; and a spacer layer between the sense layer and the storage layer; at least one of the storage layer and the sense layer having a magnetic anisotropy axis wherein the magnetic anisotropy axis is an intrinsic anisotropy;
   during a writing step to one of m logic states, wherein the storage layer is switchable between m different directions corresponding to said m logic states, with m being greater than 2:
      applying a first heating current pulse adapted for heating the magnetic tunnel junction to a temperature above the threshold temperature; and
      inducing a first write magnetic field having a predetermined amplitude and a predetermined orientation with respect to the magnetic anisotropy axis for aligning the storage magnetization in a written direction; and
   the method further comprises, performing an initialization step in response to a writing command to perform said writing step,
   wherein the initialization step comprises:
      applying a second heating current pulse adapted for heating the magnetic tunnel junction to a temperature above the threshold temperature; and
      providing a second magnetic field for adjusting the storage magnetization in an initial direction along the magnetic anisotropy axis;
   wherein the initialization step being performed prior to the writing step.

* * * * *